(12) United States Patent
Hayama

(10) Patent No.: US 7,559,148 B2
(45) Date of Patent: Jul. 14, 2009

(54) MAGNETIC AZIMUTH DETECTING DEVICE

(75) Inventor: Tsuyoshi Hayama, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/138,713

(22) Filed: Jun. 13, 2008

(65) Prior Publication Data
US 2008/0276474 A1 Nov. 13, 2008

Related U.S. Application Data

(63) Continuation of application No. PCT/JP2006/325841, filed on Dec. 26, 2006.

(30) Foreign Application Priority Data

Dec. 27, 2005 (JP) ............................. 2005-375422

(51) Int. Cl.
G01C 17/38 (2006.01)
(52) U.S. Cl. ...................... 33/355 R; 33/356
(58) Field of Classification Search ............... 33/355 R, 33/356, 357, 361, 363 R, 366.11, 366.12, 33/366.13, 366.25, 366.26
See application file for complete search history.

(56) References Cited

U.S. PATENT DOCUMENTS

| | | | | |
|---|---|---|---|---|
| 5,287,628 A | * | 2/1994 | Yamaguchi et al. | 33/361 |
| 6,543,146 B2 | * | 4/2003 | Smith et al. | 33/356 |
| 6,606,799 B2 | * | 8/2003 | Kato | 33/356 |
| 6,826,842 B2 | * | 12/2004 | Abe et al. | 33/355 R |
| 7,210,236 B2 | * | 5/2007 | Sato et al. | 33/356 |
| 2005/0072011 A1 | | 4/2005 | Miyashita et al. | |
| 2007/0033818 A1 | * | 2/2007 | Kitamura et al. | 33/355 R |
| 2008/0052933 A1 | * | 3/2008 | Yamada | 33/356 |
| 2008/0250661 A1 | * | 10/2008 | Kou et al. | 33/356 |

FOREIGN PATENT DOCUMENTS

JP 2005-114489 4/2005

* cited by examiner

Primary Examiner—G. Bradley Bennett
(74) Attorney, Agent, or Firm—Beyer Law Group LLP

(57) ABSTRACT

A magnetic azimuth detecting device is easily reduced in size. Three or more magnetic sensors 3 and a control semiconductor 4 controlling these magnetic sensors 3 are attached to and mounted on a surface of a circuit substrate 2, and the magnetic sensors 3 and the control semiconductor device 4 are encapsulated and integrated by an encapsulation member 5. The magnetic sensors 3 are divided into at least two groups, and the terminal forming surface or surfaces 6 of the magnetic sensor or sensors 3 of one group are disposed so as to be perpendicular to the terminal forming surface or surfaces 6 of the magnetic sensor or sensors 3 of another group.

5 Claims, 3 Drawing Sheets

MAGNETIC AZIMUTH DETECTING DEVICE

CLAIM OF PRIORITY

This is a continuation of International Application No. PCT/JP2006/325841, filed Dec. 26, 2006, which is incorporated herein by reference in its entirety.

BACKGROUND OF THE INVENTION

1. Field of the Invention

The present invention relates to magnetism detecting devices that detect magnetism, for example, a magnetic azimuth detecting device suitable for obtaining at least three-axis geomagnetic azimuth information.

2. Description of the Related Art

In recent years, a magnetic azimuth detecting device referred to as electronic compass has been used in mobile terminal devices such as cellular phones and personal digital assistances (PDAs), in addition to a GPS (global positioning system), for example, for the reason that it is possible to obtain azimuth information whereby it is known in which direction a destination is (see, for example, Patent Document 1).

Conventional magnetic azimuth detecting devices will be described, taking as an example a magnetic azimuth detecting device that can detect geomagnetic azimuths of three axes of the X-axis, the Y-axis, and the Z-axis, that is, the front-back direction, the left-right direction, and the top-bottom direction, used in cellular phones.

FIG. 5 shows an example of a conventional magnetic azimuth detecting device. In a conventional magnetic azimuth detecting device 101, three magnetic sensors 103 and a control semiconductor device (control semiconductor package) 104 are mounted on one of the surfaces, the upper surface, of a square planar circuit substrate 102, and the three magnetic sensors 103 and the control semiconductor device 104 are encapsulated and integrated (packaged) by an insulating encapsulation member 105 such as resin.

Of the three magnetic sensors 103, one is an X-axis magnetic sensor 103x for detecting the terrestrial magnetism in the X-axis direction (the front-back direction or the left-right direction), another is a Y-axis magnetic sensor 103y for detecting the terrestrial magnetism in the Y-axis direction (the left-right direction or the front-back direction), and the other is a Z-axis magnetic sensor 103z for detecting the terrestrial magnetism in the Z-axis direction (the top-bottom direction). These magnetic sensors 103 comprise Hall elements. Semimanufactured substrates 107 are attached to the opposite surfaces from the terminal forming surfaces 106x and 106y of two of the three magnetic sensors 103, the X-axis and Y-axis magnetic sensors 103x and 103y. By attaching side surfaces of these semimanufactured substrates 107 to the upper surface of the circuit substrate 102, the X-axis and Y-axis magnetic sensors 103x and 103y are mounted. The Z-axis magnetic sensor 103z is mounted by directly attaching the opposite surface from the terminal forming surface 106z thereof to the circuit substrate 102.

Therefore, the terminal forming surfaces 106 of the X-axis and Y-axis magnetic sensors 103x and 103y are disposed vertically relative to the upper surface of the circuit substrate 102, and the terminal forming surface 106 of the Z-axis magnetic sensor 103z is disposed horizontally relative to the upper surface of the circuit substrate 102.

That is, the terminal forming surfaces 106 of the X-axis and Y-axis magnetic sensors 103x and 103y are disposed vertically by disposing the semimanufactured substrates 107 upright relative to the upper surface of the circuit substrate 102.

The control semiconductor device 104 is for supplying drive signals to the three magnetic sensors 103 and outputting geomagnetic information of each azimuth detected by each magnetic sensor, and has a computing portion comprising a CPU or an MPU and a storage portion comprising a ROM and/or a RAM with an adequate capacity.

The control semiconductor device 104 is disposed in the center of the upper surface of the circuit substrate 102 of the magnetic azimuth detecting device 101. One of the magnetic sensors 103 is disposed in the center in the longitudinal direction of each of three sides around the control semiconductor device 104.

On the undersurface of the circuit substrate 102 is disposed an external connection electrode used for electrical connection with a device such as a cellular phone in which the magnetic azimuth detecting device is installed.

Patent Document 1: Japanese Unexamined Patent Application Publication No. 2005-114489

SUMMARY OF THE INVENTION

In recent years, various devices have been required to be reduced in size. As part of reducing various devices in size, magnetic azimuth detecting devices have also been required to be reduced in size. The present invention is made in view of this.

An object of the present invention is to provide a magnetic azimuth detecting device that can be easily reduced in size.

To attain this object, a magnetic azimuth detecting device according to the present invention is characterized in that three or more magnetic sensors and a control semiconductor controlling these are attached to and mounted on a surface of a circuit substrate, the magnetic sensors and the control semiconductor device are encapsulated and integrated by an encapsulation member, the magnetic sensors are divided into at least two groups, and the terminal forming surface or surfaces of the magnetic sensor or sensors of one group are disposed so as to be perpendicular to the terminal forming surface or surfaces of the magnetic sensor or sensors of another group.

It is preferable that the groups be disposed away from each other. It is preferable that the magnetic sensors be disposed closely to each other in each group. It is preferable that on the surface of the encapsulation member be provided a mark by which information of the position of at least one of the magnetic sensors can be recognized from outside.

It is preferable that the magnetic sensors have at least an X-axis magnetic sensor for detecting the terrestrial magnetism in an X-axis direction, a Y-axis magnetic sensor for detecting the terrestrial magnetism in a Y-axis direction, and a Z-axis magnetic sensor for detecting the terrestrial magnetism in a Z-axis direction, the X-axis and Y-axis magnetic sensors form a group, and the Z-axis magnetic sensor form another group.

Since three or more magnetic sensors and a control semiconductor controlling these magnetic sensors are mounted on a surface of a circuit substrate in a magnetic azimuth detecting device according to the present invention, it has excellent advantages such as ease of size reduction.

DESCRIPTION OF THE PREFERRED EMBODIMENTS

Figure 1:
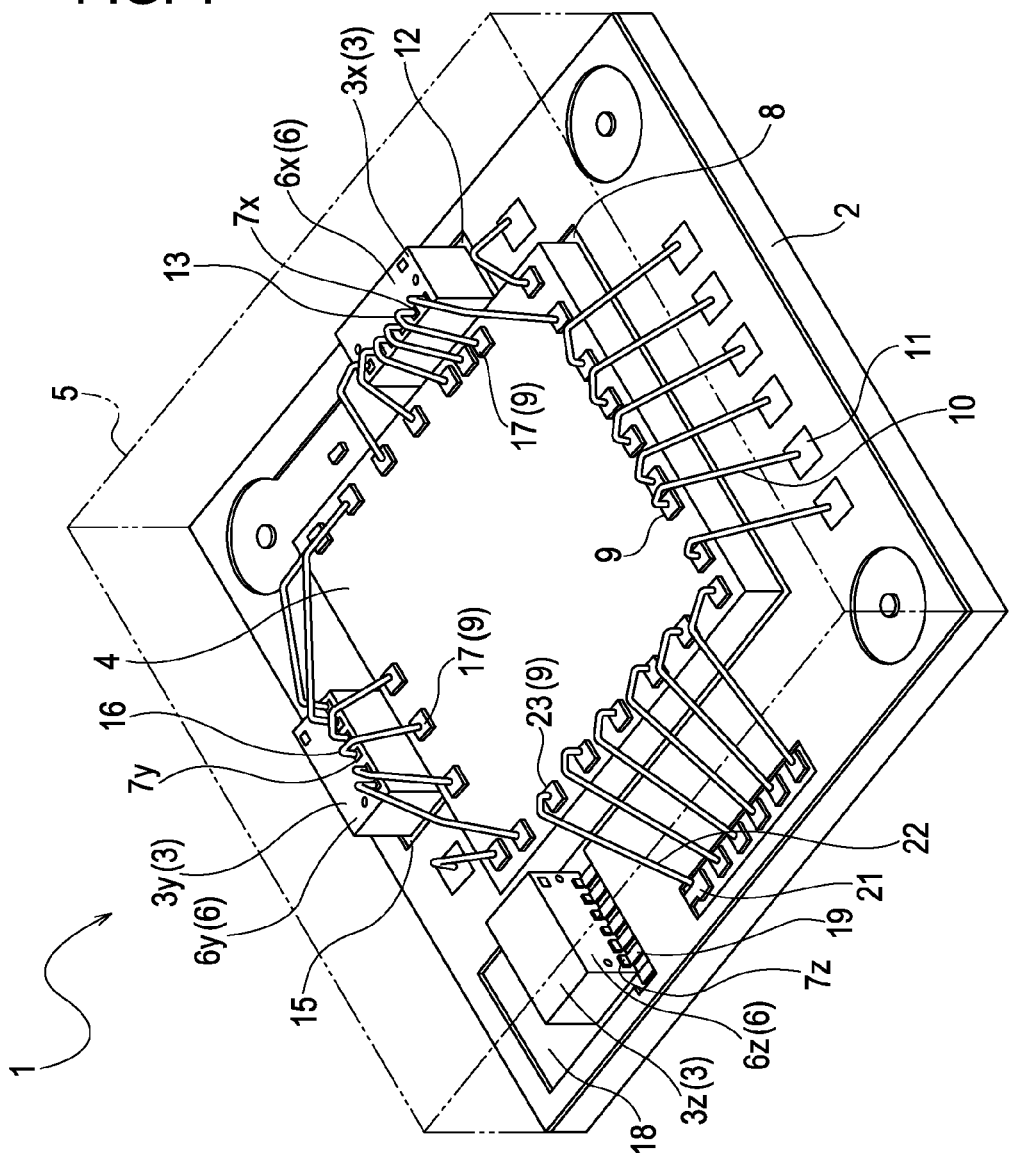
FIG. 1 is a schematic perspective view showing essential parts of a first embodiment of a magnetic azimuth detecting device according to the present invention.

The present invention will now be described with reference to embodiments shown in the drawings.

Figure 2:
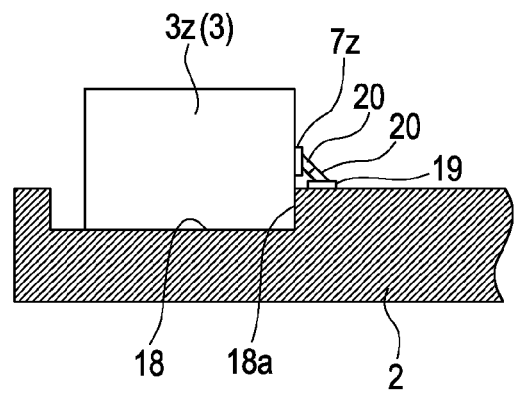
FIG. 2 is an enlarged sectional view of an attachment portion for the Z-axis magnetic sensor of FIG. 1 and its vicinity.

FIGS. 1 and 2 show a first embodiment of a magnetic azimuth detecting device according to the present invention. FIG. 1 is a schematic perspective view showing essential parts. FIG. 2 is an enlarged sectional view of a Z-axis magnetic sensor attachment portion and its vicinity.

As shown in FIG. 1, in the magnetic azimuth detecting device 1 of this embodiment, three magnetic sensors: an X-axis magnetic sensor 3x for detecting the terrestrial magnetism in the direction of the X-axis, a Y-axis magnetic sensor 3y for detecting the terrestrial magnetism in the direction of the Y-axis, and a Z-axis magnetic sensor 3z for detecting the terrestrial magnetism in the direction of the Z-axis, and one control semiconductor device (control semiconductor package) 4 are directly attached to and mounted on one of the surfaces, the upper surface, of a square planar circuit substrate 2. The three magnetic sensors 3 and the one control semiconductor device 4 are encapsulated and integrated by an insulating encapsulation member 5. The magnetic azimuth detecting device 1 of this embodiment is formed like a flat plate 3.5 mm long, 3.5 mm wide, and 1 mm high.

The circuit substrate 2 is formed by providing a desired wiring pattern on an insulating substrate formed of ceramics or insulating resin such as epoxy resin, polyimide, polyethylene terephthalate, or polymethylmethacrylate, and coating all portions of this wiring pattern except terminal forming portions with a protective coat. In addition, on the undersurface of the circuit substrate 2 of this embodiment is provided an external connection terminal (not shown), such as a solder land, connected through a through-hole.

For example, MR (MagnetoResistance effect) elements, GIG (Granular In Gap) elements, MI (MagnetoImpedance) elements, flux-gate sensors, and semiconductor Hall effect sensors can be used as the magnetic sensors 3. In this embodiment, MR elements are used.

The X-axis and Y-axis magnetic sensors 3x and 3y are formed like flat plates 0.30 mm long, 0.60 mm wide, and 0.35 mm high. On the terminal forming surfaces 6x and 6y thereof are disposed matrices of electrodes 7x and 7y, respectively, serving as connecting terminals. The Z-axis magnetic sensor 3z is formed like a flat plate 0.30 mm long, 0.60 mm wide, and 0.35 mm high. On the terminal forming surface 6z thereof is disposed a line of electrodes 7z serving as connecting terminals. Of course, the three magnetic sensors 3 may have the same constitution.

The number of magnetic sensors 3 may be four or more so that more azimuths, for example, the inclination of the magnetic azimuth detecting device 1 can be detected.

For example, thermosetting resins such as epoxy resin, phenol resin, and unsaturated polyester resin, and thermoplastic resins such as general-purpose engineering plastic and super engineering plastic can be used as the encapsulation member 5. It is possible to blend (polymer blend) two or more materials by a chemical or mechanical method during the production process.

In the center of the upper surface of the circuit substrate 2 is recessed a semiconductor attachment portion 8 having an opening slightly larger than the control semiconductor device 4 and having a predetermined depth. The control semiconductor device 4 is directly attached to and mounted on the bottom surface of the semiconductor attachment portion 8, with a jointing material, with electrodes 9 thereof facing upward. One ends of lead wires 10 serving as connecting members and comprising, for example, thin gold wires are connected to the electrodes 9 of the control semiconductor device 4 by the wire bonding method. The other ends of the lead wires 10 are connected to electrodes 11 of the circuit substrate 2 used for connection with the control semiconductor device 4.

The control semiconductor device 4 of this embodiment is formed like a flat plate 2.0 mm long, 2.0 mm wide, and 0.23 mm high.

Substantially in the center of the right side shown in the upper right in FIG. 1 of a portion of the upper surface of the circuit substrate 2 around the semiconductor attachment portion 8 is recessed an X-axis sensor attachment portion 12 having a rectangular opening slightly larger than the X-axis magnetic sensor 3x and having a predetermined depth. The X-axis magnetic sensor 3x is directly attached to and mounted on the bottom surface of the X-axis sensor attachment portion 12, with a jointing material, with the electrodes (pads) 7x facing upward, which are connecting terminals provided on the terminal forming surface 6x. That is, the terminal forming surface 6x of the X-axis magnetic sensor 3x is disposed horizontally relative to the upper surface of the circuit substrate 2. One ends of lead wires 13 serving as connecting members and comprising, for example, thin gold wires are connected to the electrodes 7x of the X-axis magnetic sensor 3x by the wire bonding method. The other ends of the lead wires 13 are connected to electrodes 14 of the control semiconductor device 4 used for connection with the X-axis magnetic sensor 3x.

Substantially in the center of the top side shown in the upper left in FIG. 1 of the portion of the upper surface of the circuit substrate 2 around the semiconductor attachment portion 8 is recessed a Y-axis sensor attachment portion 15 having a rectangular opening slightly larger than the Y-axis magnetic sensor 3y and having a predetermined depth. The Y-axis magnetic sensor 3y is directly attached to and mounted on the bottom surface of the Y-axis sensor attachment portion 15, with a jointing material, with the electrodes (pads) 7y facing upward, which are connecting terminals provided on the terminal forming surface 6y. That is, the terminal forming surface 6y of the Y-axis magnetic sensor 3y is disposed horizontally relative to the upper surface of the circuit substrate 2. One ends of lead wires 16 serving as connecting members and comprising, for example, thin gold wires are connected to the electrodes 7y of the Y-axis magnetic sensor 3y by the wire bonding method. The other ends of the lead wires 16 are connected to electrodes 17 of the control semiconductor device 4 used for connection with the Y-axis magnetic sensor 3y.

In the corner in the left in FIG. 1 of the portion of the upper surface of the circuit substrate 2 around the semiconductor attachment portion 8 is recessed a Z-axis sensor attachment portion 18 having a rectangular opening larger than the Z-axis magnetic sensor 3z and having a predetermined depth. A side surface of the Z-axis magnetic sensor 3z is directly attached to and mounted on the bottom surface of the Z-axis sensor attachment portion 18. That is, the Z-axis magnetic sensor 3z is attached, with a jointing material, with the electrodes 7z facing sideways, which are connecting terminals provided on the terminal forming surface 6 thereof. The terminal forming surface 6z of the Z-axis magnetic sensor 3z is disposed vertically relative to the upper surface of the circuit substrate 2.

As shown in FIG. 2, the Z-axis magnetic sensor 3z is disposed in such a manner that the terminal forming surface 6 thereof is in contact with an inner side surface 18a of the Z-axis magnetic sensor attachment portion 18. By making the permissible range of the squareness of the inner side surface 18a, with which the terminal forming surface 6z is in contact, relative to the bottom surface of the Z-axis magnetic sensor attachment portion 18 within about six degrees, preferably within three degrees, the azimuth in the Z-axis direction can be detected easily and properly. The electrodes 7z of the Z-axis magnetic sensor 3z and electrodes 19 of the circuit substrate 2 used for connection with the Z-axis magnetic sensor 3z are provided with bumps 20 having an angle of 45 degrees and formed, for example, of gold, to facilitate the connection. Both bumps 20 are electrically connected, for example, by an anisotropic conductive material or a solder. The electrodes 19 of the circuit substrate 2 are connected with their counterpart electrodes 21 by a wiring pattern. One ends of lead wires 22 serving as connecting members and comprising, for example, thin gold wires are connected to the counterpart electrodes 21 by the wire bonding method. The other ends of the lead wires 22 are connected to electrodes 23 of the control semiconductor device 4 used for connection with the Z-axis magnetic sensor 3z.

The Z-axis magnetic sensor 3z may have the same constitution as the X-axis and Y-axis magnetic sensors 3y. In this case, lead wires comprising, for example, thin gold wires can be used as connecting members for the wire bonding method.

Therefore, in the magnetic azimuth detecting device of this embodiment, the three magnetic sensors 3 are divided into two groups: a group consisting of the X-axis and Y-axis magnetic sensors 3x and 3y, and a group consisting of the Z-axis magnetic sensor 3z. In addition, the terminal forming surfaces 6x and 6y of the magnetic sensors 3x and 3y of the former group are disposed so as to be perpendicular to the terminal forming surface 6z of the Z-axis magnetic sensor 3z of the latter group. It is preferable to arrange the groups away from each other. This separate arrangement will be described in detail in a second embodiment to be described below.

Alternatively, it is possible to dispose the terminal forming surfaces 6x and 6y of the X-axis and Y-axis magnetic sensors 3x and 3y vertically, and the terminal forming surface 6z of the Z-axis magnetic sensor 3z horizontally relative to the circuit substrate 2.

Next, the advantages of this embodiment having the above-described constitution will be described.

Since the magnetic azimuth detecting device 1 of this embodiment has the three magnetic sensors 3, geomagnetic azimuths of three axes of the X-axis, the Y-axis, and the Z-axis can be detected.

In addition, since, in the magnetic azimuth detecting device 1 of this embodiment, the three magnetic sensors 3 are directly attached to and mounted on the upper surface of the circuit substrate 2, the semimanufactured substrate 107 in the conventional magnetic azimuth detecting device 101 need not be provided. As a result, the three magnetic sensors 3 can be easily directly attached to and mounted on the circuit substrate 2, and size reduction can be easily and surely achieved.

Moreover, since, in the magnetic azimuth detecting device 1 of this embodiment, the conventional semimanufactured substrate 107 can be omitted, cost reduction by reducing the number of components and production processes can also be easily and surely achieved.

That is, the conventional magnetic azimuth detecting device 101 requires two processes of: mounting the magnetic sensors 103 on the semimanufactured substrates 107, and mounting the semimanufactured substrates 107 on which the magnetic sensors 103 are mounted on the circuit substrate 102, whereas the magnetic azimuth detecting device 1 of this embodiment requires only one process of mounting the magnetic sensors 3 on the circuit substrate 2.

Figure 3:
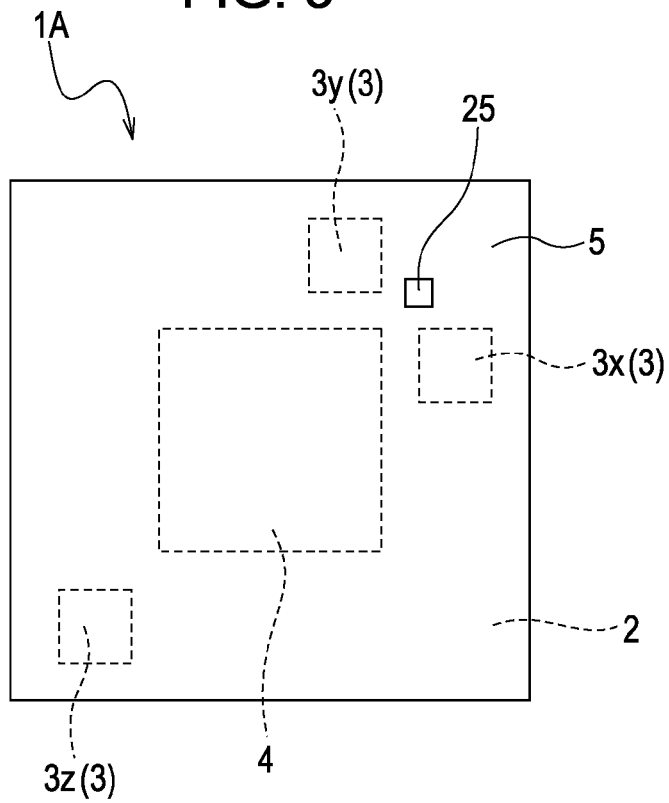
FIG. 3 is a schematic plan view showing essential parts of a second embodiment of a magnetic azimuth detecting device according to the present invention.

FIG. 3 is a schematic plan view showing essential parts of a second embodiment of a magnetic azimuth detecting device according to the present invention. The same reference numerals will be used in the figure to designate the same or similar components as those of the magnetic azimuth detecting device 1 of the above-described first embodiment.

The magnetic azimuth detecting device 1A of this embodiment can reduce the influence of an external magnetic field.

As shown in FIG. 3, in the magnetic azimuth detecting device 1A of this embodiment, the X-axis and Y-axis magnetic sensors 3x and 3y are disposed closely to each other in the vicinity of the right corner of FIG. 3, and the Z-axis magnetic sensor 3z is disposed in the vicinity of the lower left corner of FIG. 3.

That is, the three magnetic sensors 3 are divided into two groups: a group consisting of the X-axis and Y-axis magnetic sensors 3x and 3y, and a group consisting of the Z-axis magnetic sensor 3z. In the former group, the X-axis and Y-axis magnetic sensors 3x and 3y are disposed closely to each other.

That is, in the magnetic azimuth detecting device 1A of this embodiment, the magnetic sensors 3 are disposed closely to each other in each group, and the groups are disposed away from each other.

A more detailed description will be given. The detection results of the magnetic sensors 3 are influenced by the relationship between the attachment direction of the magnetic sensors 3 relative to the circuit substrate 2 (the attachment direction of the terminal forming surfaces 6 and therefore the detecting circuits) and an external magnetic field. Since the group consisting of the Z-axis magnetic sensor 3z and the group consisting of the X-axis and Y-axis magnetic sensors 3x and 3y are disposed away from each other, the minimum magnetism needed for azimuth detection can be detected by the group consisting of the X-axis and Y-axis magnetic sensors 3x and 3y even if the group consisting of the Z-axis magnetic sensor 3z is influenced by an external magnetic field. In addition, since the magnetic sensors 3 are disposed closely to each other in each group, the distance between the groups can be made larger.

Detecting the minimum magnetism will be described. In general, the magnetic azimuth detecting device 1A is formed so as to be able to detect the azimuth using the X-axis and Y-axis magnetic sensors 3x and 3y in a horizontal plane. Such a constitution cannot perform accurate azimuth detection when the magnetic azimuth detecting device 1A is tilted, for example, when a cellular phone having the magnetic azimuth detecting device (electronic compass) 1A therein is held in hand and used at a tilt. In addition to the X-axis and Y-axis magnetic sensors 3x and 3y, the Z-axis magnetic sensor 3z is used so that accurate azimuth can be detected even when the magnetic azimuth detecting device 1A is tilted. Therefore, detecting the minimum magnetism is detecting accurate azimuth using the X-axis and Y-axis magnetic sensors 3x and 3y, by making the magnetic azimuth detecting device 1A horizontal, even if the Z-axis magnetic sensor 3z cannot be used due to the influence of an external magnetic field.

Therefore, in the magnetic azimuth detecting device 1A of this embodiment, the magnetic sensors 3 are grouped according to the attachment direction of the terminal forming surface (detecting circuit) 6 (reference numeral 6 generically denotes the three terminal forming surfaces 6x, 6y, and 6z), the magnetic sensors 3 are disposed closely to each other in each group, and the groups are disposed away from each other.

Figure 4:
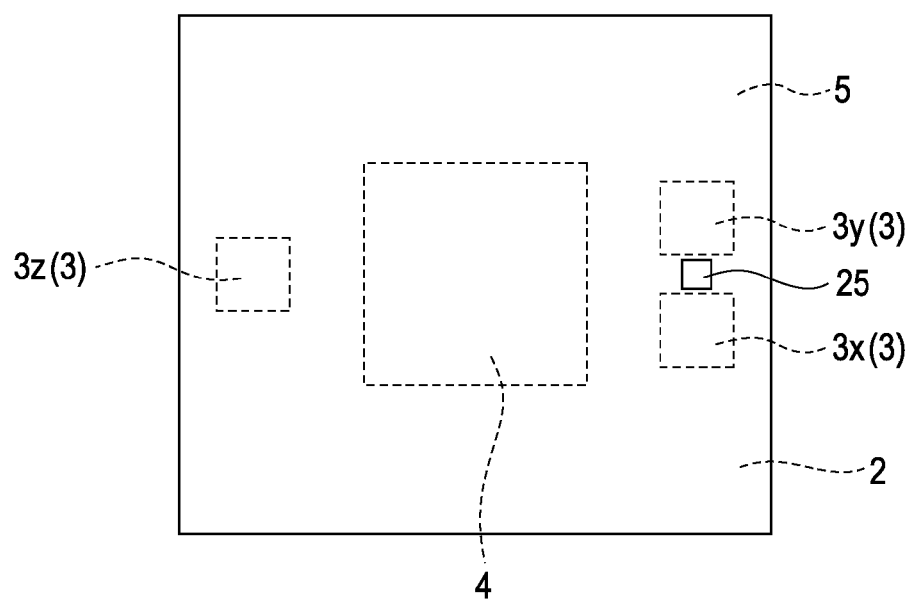
FIG. 4 is a schematic plan view showing a modification of the positions of the magnetic sensors in the magnetic azimuth detecting device according to the present invention.
Figure 5:
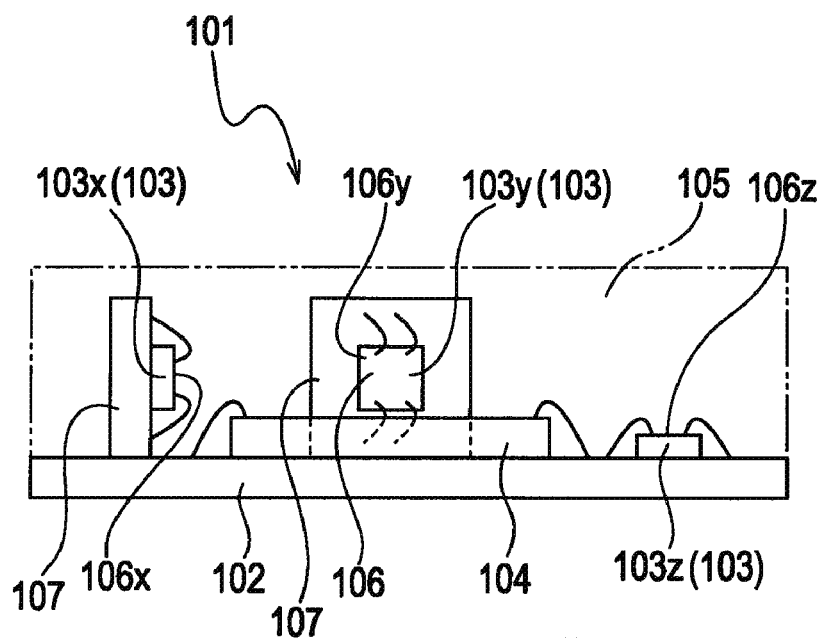
FIG. 5 is a schematic side view showing essential parts of a conventional magnetic azimuth detecting device.

As for the positions of the magnetic sensors 3, it is possible to dispose the X-axis and Y-axis magnetic sensors 3x and 3y on one of two opposite sides, and the Z-axis magnetic sensor 3z on the other side. For example, as shown in FIG. 4, it is possible to dispose the magnetic sensors 3 in such a manner that the groups are separated on both sides in the longitudinal direction of the circuit substrate 2 formed in a horizontally long rectangular shape. The positions of the groups can be changed depending on the shape and size of the circuit substrate 2, the number of groups, the shape and size of the magnetic sensors 3, and the shape and size of the control semiconductor device 4. However, it is preferable to dispose the groups as far away as possible from each other because the minimum magnetism for performing azimuth detection can be detected even if they are influenced by an external magnetic field. It is more preferable to dispose the magnetic sensors 3 as closely as possible to each other in each group.

Of course, all of the magnetic sensors 3 may be concentrated at a position. This makes it possible to achieve size reduction as well as concentration of the sensors and the control semiconductor device.

In addition, in the magnetic azimuth detecting device 1A of this embodiment, a mark 25 by which information of the positions of the magnetic sensors 3 in the group consisting of the X-axis and Y-axis magnetic sensors 3x and 3y can be recognized from outside, is provided in the vicinity of the upper right corner of FIG. 3 on the surface of the encapsulation member 5.

The mark 25 only has to be provided at a position where information of the position of at least one of a plurality of magnetic sensors 3 can be recognized from outside. For example, a mark 25 may be provided over each of three magnetic sensors 3. In this case, the marks 25 may be made in different colors or provided with different symbols, for example, X, Y, and Z, so that both the position and detecting azimuth of each magnetic sensor 3 can be recognized.

In the case of a single mark 25, the mark 25 is provided in such a manner that the position of the magnetic sensor 3 susceptible to an external magnetic field, for example, a magnetic field from a speaker or a memory card in a cellular phone can be recognized from outside.

In this embodiment, the positions of the two magnetic sensors 3 of the group consisting of the two magnetic sensors 3 comprising the X-axis and Y-axis magnetic sensors 3x and 3y can be recognized by the single mark 25 shown in FIG. 3.

The other constitutions are the same as those of the magnetic azimuth detecting device 1 of the above-described first embodiment, and therefore detailed description thereof will be omitted.

The magnetic azimuth detecting device 1A of this embodiment having such a constitution has the same advantages as the magnetic azimuth detecting device 1 of the above-described first embodiment. In addition, since the group consisting of the X-axis and Y-axis magnetic sensors 3x and 3y and the group consisting of the Z-axis magnetic sensor 3z are disposed away from each other, the maximum magnetism needed for azimuth detection can be detected by the group consisting of the X-axis and Y-axis magnetic sensors 3x and 3y even if the group consisting of the Z-axis magnetic sensor 3z is influenced by an external magnetic field. Moreover, since the X-axis and Y-axis magnetic sensors 3x and 3y are disposed closely to each other as a group, the distance between the groups can be made larger. As a result, the reliability can be improved.

Furthermore, since, in the magnetic azimuth detecting device 1A of this embodiment, the positions where the magnetic sensors 3 are mounted can be indicated by the mark 25, putting the mark 25 in a drawing makes it possible to draw attention of a designer of a device having the magnetic azimuth detecting device 1A therein so that a portion generating an external magnetic field is not disposed in the vicinity of the mark 25 in the early stage of design. As a result, a designer of a device having the magnetic azimuth detecting device 1A therein can easily arrange components in such a manner that the magnetic sensors 3 are less influenced by an external magnetic field.

Therefore, in addition to the advantages in the magnetic azimuth detecting device 1 of the first embodiment, the magnetic azimuth detecting device 1A of this embodiment has the advantage that the reliability can be surely and easily improved, and therefore high performance can be easily achieved.

The present invention is not limited to the above-described embodiments, and various changes may be made therein if necessary.

What is claimed is:

1. A magnetic azimuth detecting device wherein three or more magnetic sensors and a control semiconductor controlling these are attached to and mounted on a surface of a circuit substrate, the magnetic sensors and the control semiconductor device are encapsulated and integrated by an encapsulation member, the magnetic sensors are divided into at least two groups, and the terminal forming surface or surfaces of the magnetic sensor or sensors of one group are disposed so as to be perpendicular to the terminal forming surface or surfaces of the magnetic sensor or sensors of another group.

2. The magnetic azimuth detecting device according to claim 1, wherein the groups are disposed away from each other.

3. The magnetic azimuth detecting device according to claim 1, wherein the magnetic sensors are disposed closely to each other in each group.

4. The magnetic azimuth detecting device according to claim 1, wherein on the surface of the encapsulation member is provided a mark by which information of the position of at least one of the magnetic sensors can be recognized from outside.

5. The magnetic azimuth detecting device according to claim 1, wherein the magnetic sensors has at least an X-axis magnetic sensor for detecting the terrestrial magnetism in an X-axis direction, a Y-axis magnetic sensor for detecting the terrestrial magnetism in a Y-axis direction, and a Z-axis magnetic sensor for detecting the terrestrial magnetism in a Z-axis direction, the X-axis and Y-axis magnetic sensors form a group, and the Z-axis magnetic sensor forms another group.

* * * * *